United States Patent [19]
Hyink et al.

[11] 4,087,848
[45] May 2, 1978

[54] THERMALLY SELF-PROTECTED POWER SWITCHING SEMICONDUCTOR DEVICE

[75] Inventors: Roy Hyink, Wauwatosa; Stanley V. Jaskolski, Sussex; Robert W. Lade, Waukesha; Herman P. Schutten, Elm Grove; Gordon B. Spellman, Mequon, all of Wis.

[73] Assignee: Cutler-Hammer, Inc., Milwaukee, Wis.

[21] Appl. No.: 725,105

[22] Filed: Sep. 20, 1976

[51] Int. Cl.² ........................................... H02H 5/04
[52] U.S. Cl. ............................... 361/103; 307/252 B; 307/310; 307/252 R
[58] Field of Search ................. 361/103, 106; 321/11, 321/12, 16; 323/19, 22 SL, 24, 68; 219/494, 501; 307/252 R, 252 A, 252 B, 252 J, 252 H, 310, 305; 357/28, 38, 39

[56] References Cited

U.S. PATENT DOCUMENTS

| | | | |
|---|---|---|---|
| 3,564,293 | 2/1971 | Mungenast | 307/252 |
| 3,600,650 | 8/1971 | Obenhaus | 357/28 |
| 3,622,849 | 11/1971 | Kelly, Jr. et al. | 361/100 |
| 3,708,720 | 1/1973 | Whitney et al. | 361/27 |
| 3,896,369 | 7/1975 | Nakata | 323/19 |
| 3,920,955 | 11/1975 | Nakata | 219/494 X |
| 3,942,075 | 3/1976 | Maran et al. | 361/106 |
| 3,959,621 | 5/1976 | Nakata | 219/494 X |
| 3,971,056 | 7/1976 | Jaskolski et al. | 307/310 X |
| 4,009,482 | 2/1977 | Nakata | 357/28 |

OTHER PUBLICATIONS

"Analog Integrated Circuit Design", By Alan B. Grebene, Van Nostrand Reinhold Company, 1972, pp. 104–108, sec. 3.5, Pinched Resistors.

*Primary Examiner*—Patrick R. Salce
*Attorney, Agent, or Firm*—Hugh R. Rather; William A. Autio; Michael E. Taken

[57] ABSTRACT

A semiconductor device is disclosed comprising a temperature sensitive thyristor thermally coupled to a power switching thyristor and electrically connected in parallel with the gate of the latter. The temperature sensitive thyristor senses the temperature of the power switching thyristor and automatically responds thereto above a predetermined temperature by shunting the gate current to prevent overheating of the power switching thyristor. The device may additionally include a second temperature sensitive thyristor having a lower switching temperature than the first mentioned thyristor and connected in series with the gate of the power switching thyristor whereby the latter may be triggered into conduction only within a defined temperature range bounded by the switching temperatures of the temperature sensitive thyristors. Normally off and normally on devices are also disclosed.

21 Claims, 6 Drawing Figures

THERMALLY SELF-PROTECTED POWER SWITCHING SEMICONDUCTOR DEVICE

BACKGROUND OF THE INVENTION

Semiconductor power switches connected in series with a load and having a semiconductor temperature switch in a gate circuit for controlling the conduction state in response to temperature are known. In order to protect the load from overheating, the temperature switch is commonly heated by a resistor connected across the load or is heated by the load itself by being placed in heat transfer relation therewith. The temperature switch responds above a certain sensed load temperature to shunt gate current whereby the power switch is turned off and the load protected against overheating.

While these devices have been useful for their intended purposes, they are not thermally self-protected with the resultant disadvantage of loss of gate control if the power switch junctions suffer thermal breakdown before load heat activates the temperature switch. In such a case, the power switch junctions have no current-blocking ability and the power switch will remain "on" regardless of whether the temperature switch subsequently shunts gate current; the load is thus no longer protected from overheating and must be manually deenergized to prevent damage thereto.

SUMMARY OF THE INVENTION

The present invention overcomes the abovenoted and other disadvantages by providing a thermally self-protected device wherein the temperature switch is thermally coupled to the power switch to directly sense the temperature of the latter. The temperature switch responds to a predetermined temperature of the power switch which is less than the thermal breakover temperature of the power switch. By protecting the power switch, the present invention eliminates the possibility of loss of gate control, thus assuring continued automatic thermal protection.

This invention relates to a power switching semiconductor device which automatically inhibits gate turn-on above a predetermined temperature of the device itself.

An object of the present invention is to provide a thermally self-protected power switching semiconductor device.

Another object is to provide a device of the aforementioned character comprising a temperature sensitive thyristor electrically connected in parallel with the gate of and thermally coupled to a power switching thyristor to respond to the temperature of the latter to protect it from overheating by shunting gate current above a predetermined temperature of the power switching thyristor.

Another object is to provide a device of the aforementioned character which has three point termination and pin-to-pin compatibility so that it may be substituted for standard SCR's, triacs, etc., without the need of additional or specially adapted wiring or circuitry, whereby to afford not only power switching but also automatic thermal self-protection.

Another object is to provide a device of the aforementioned character wherein the predetermined temperature of the power switching thyristor which is sensed and responded to by the temperature sensitive thyristor is less than a value corresponding to an overcurrent condition of a load in series with the power switching thyristor whereby to afford load protection in addition to self-protection.

Another object is to provide a device of the aforementioned character including a second temperature sensitive thyristor having a switching temperature less than the switching temperature of the first mentioned temperature sensitive thyristor and electrically connected in series with the gate of the power switching thyristor, whereby the power switching thyristor is in its conductive state only within a defined temperature range bounded by the corresponding switching temperatures of the temperature sensitive thyristors.

Other objects and advantages will hereinafter appear.

DESCRIPTION OF THE PREFERRED EMBODIMENT

Figure 1:
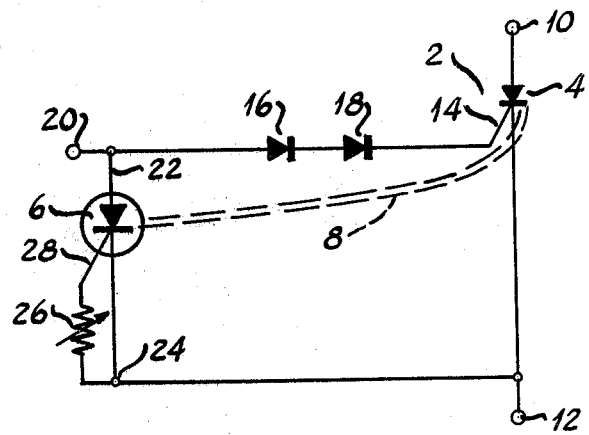
FIG. 1 is a schematic circuit diagram of the preferred embodiment of the present invention.

There is shown in FIG. 1 a thermally self-protected power switching semiconductor device 2 constructed in accordance with the invention. A semiconductor power switch 4, such as a unilateral triode thyristor, e.g. an SCR, is thermally coupled to a temperature sensitive thyristor 6 by heat transfer means 8.

The power switching thyristor has an anode 10 and cathode 12 for connection to a load, for example, and a gate 14 for triggering the thyristor into conduction. A pair of voltage dropping diodes 16 and 18 are connected in series between gate 14 and a gate terminal 20, the latter being connectable to a source of signal current.

The temperature sensitive thyristor has an anode 22 connected to gate terminal 20 and a cathode 24 connected to the cathode 12 of the power switching thyristor. A variable resistance 26 may be connected across a gate 28 and the cathode 24 of the temperature sensitive thyristor for varying the switching temperature, the greater the resistance the lower the switching temperature.

The temperature sensitive thyristor 6 is thermally actuatable to intrinsically switch between high and low resistance states in response to a predetermined temperature. Two preferred types of temperature sensitive thyristors are those disclosed in Jaskolski et al U.S. Pat. No. 3,971,056, issued July 20, 1976, and Jaskolski et al Application Ser. No. 652,192, filed Jan. 26, 1976, both assigned to the assignee of this invention; the former disclosing a germanium thyristor having a switching temperature selectably predeterminable in the range −55° C to +55° C, and the latter disclosing a silicon thyristor having a switching temperature selectably predeterminable in the range −30° C to +150° C. By preselecting and/or adjusting the switch temperature of thyristor 6, it can be made to switch from its high to its low resistance state in response to a predetermined temperature of the power switching thyristor sensed through heat transfer means 8.

When the temperature of thyristor 4 is below said predetermined temperature, thyristor 6 is in its high resistance state whereby signal current applied at gate terminal 20 will flow to gate 14 and trigger thyristor 4 into its conducting state and thus energize, for example, a load in series with terminals 10 and 12. If the temperature of thyristor 4 exceeds said predetermined temperature, thyristor 6 intrinsically switches to its low resistance state whereby signal current applied at gate terminal 20 will now flow through thyristor 6, not to gate 14, thereby shunting gate 14 and inhibiting turn-on of thyristor 4. The predetermined temperature at which the power switching thyristor is automatically inhibited from gate turn-on is set below the thermal breakover temperature thereof, whereby device 2 is a thermally self-protected power switching semiconductor device.

Signal current is diverted through thyristor 6 in its low resistance state rather than flowing to gate 14 because the sum of the voltage drops across diodes 16 and 18 and gate 14 is greater than the voltage drop across thyristor 6 in its low resistance state. The voltage drop across diodes 16 and 18 is less than a value which would reduce the voltage drop across gate 14 below that necessary to trigger thyristor 4 into conduction. Other voltage dropping means may of course be used, if necessary at all, to provide proper shunting of gate 14.

As shown in FIG. 1, device 2 has three point termination, namely, terminals 10, 12 and 20, whereby device 2 may be substituted for standard power switches, such as SCR's, triacs, etc., without additional or specially adapted wiring or circuitry to provide not only power switching but also automatic thermal self-protection.

Device 2 may further be used for load protection, if desired. Said predetermined temperature is set lower than a value corresponding to an overcurrent condition of a load in series with the power switching thyristor whereby the latter is rendered non-conductive before overheating of the load. The temperature sensitive thyristor does not have to be thermally coupled to the load nor must it be heated by a resistor. Device 2 can be far removed from the load because the current through the load also flows through thyristor 4 which heats thyristor 6. A designated overload current is correlated to a designated temperature of thyristor 4, and said predetermined temperature is made less than said designated temperature, whereby device 2 is automatically inhibited from turning on in response to overcurrent conditions to thereby protect the load.

A feature of device 2 is the latching thereof when D.C. gate drive is applied to terminal 20. If an A.C. load is connected in series with terminals 10 and 12, and the temperature of the power switching thyristor exceeds said predetermined temperature, the temperature sensitive thyristor will automatically respond thereto by shunting gate 14 to turn off the power switching thyristor. Even if the temperature of the power switching thyristor subsequently falls below said predetermined temperature, the temperature sensitive thyristor will remain conductive because of the steady D.C. current flowing therethrough from terminal 20. The power switching thyristor thus remains latched off because signal current is continually shunted away from gate 14, i.e., the power switching thyristor will conduct only during the remainder of the A.C. cycle before the load voltage passes through zero, and remain latched off thereafter. Device 2 must be externally reset before the power switching thyristor can be rendered conductive again.

A.C. gate drive or pulsed D.C. gate do not afford latching, but rather permit the power switching thyristor to be automatically rendered conductive again after the temperature thereof falls below said predetermined temperature. When the temperature sensitive thyristor switches into conduction in response to heat sensed from the power switching thyristor when the latter exceeds said predetermined temperature, the temperature sensitive thyristor will remain conductive as long as the temperature of said power switching thyristor is above said predetermined temperature, thereby shunting gate 14 and rendering the power switching thyristor non-conductive. If, however, the temperature of the power switching thyristor falls below said predetermined temperature, the temperature sensitive thyristor will remain conductive only until the A.C. or pulsed D.C. voltage applied at terminal 20 returns to or passes through zero during its cycle, after which the temperature sensitive thyristor switches to its high resistance state thereby blocking current flow therethrough and diverting signal current to gate 14 to thereby retrigger the power switching thyristor into conduction. Thus when an A.C. or a pulsed gate drive is used with device 2, a load may automatically be deenergized above a certain temperature and automatically reenergized below that temperature.

Figure 2:
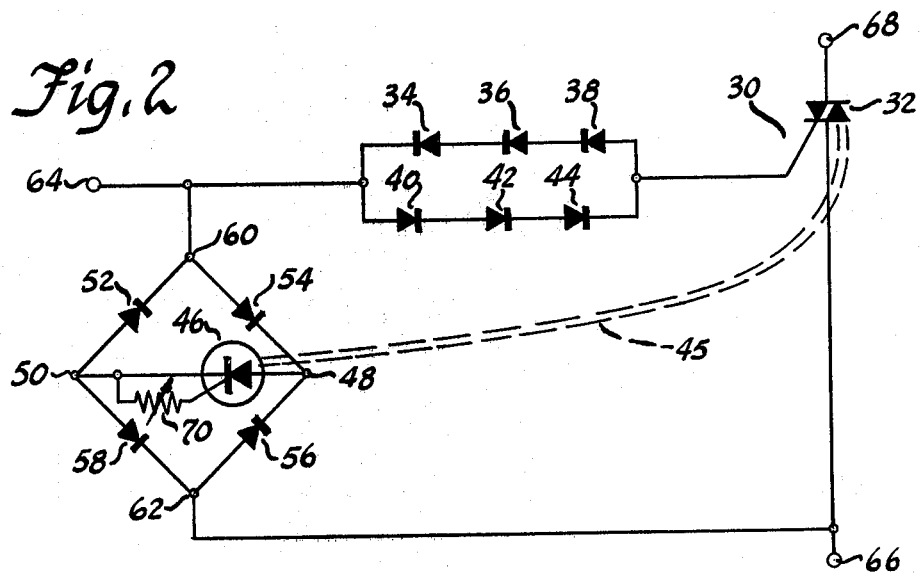
FIG. 2 is a bilateral version of FIG. 1.

FIG. 2 shows a bilateral version 30 of FIG. 1 wherein a bilateral triode thyristor, 32, e.g. a triac, is the power switch. The voltage dropping means include diodes 34, 36 and 38 in anti-parallel relation with diodes 40, 42 and 44. A temperature sensitive thyristor 46 is thermally coupled to power switch 32 by heat transfer means 45 and is connected between the D.C. outputs 48 and 50 of a diode rectifying bridge comprised of diodes 52, 54, 56 and 58. The A.C. inputs 60 and 62 of the bridge are connected between a gate terminal 64 and main terminal 66 or the power switch. A variable resistance 70 may be connected across a gate and cathode of thyristor 46 for adjusting the switching temperature thereof. The above teachings regarding automatic thermal self-protection, three point termination, load protection, latching, etc., are also applicable to device 30.

Figure 3:
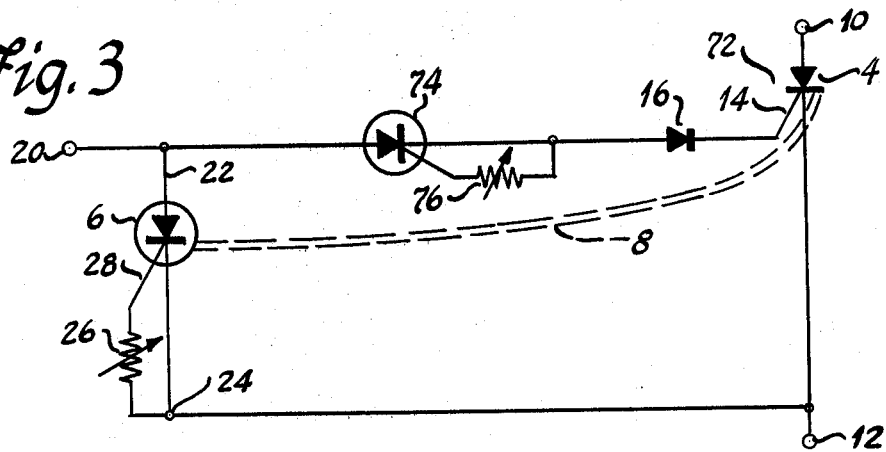
FIGS. 3–5 show various modifications of the present invention.

FIG. 3 shows a device 72 similar to device 2 of FIG. 1, but having a second temperature sensitive thyristor 74. Corresponding elements in FIGS. 1 and 3 have the same reference characters to facilitate clarity of understanding. A variable resistance 76 may be connected across a gate and cathode of thyristor 74 for varying the switching temperature thereof. Thyristor 74 is preferably one of those disclosed in said Jaskolski et al Patent or said Jaskolski et al Application and is selected to have a switching temperature lower than said predetermined temperature of the power switching thyristor 4 to which thyristor 6 responds by changing states. Thyristor 74 is connected in series with gate 14, and voltage dropping means, such as diode 16, is included to insure that the sum of the voltage drop across thyristor 74, diode 16 and gate 14, is greater than the voltage drop across thyristor 6 when both thyristors 6 and 74 are in their low resistance states, whereby to insure proper shunting of gate 14. It is thus seen that power switching thyristor 4 of device 72 will be in its conducting state only within a defined temperature range bounded at the lower end by the switching temperature of thyristor 74 and at the upper end by said predetermined temperature.

Figure 4:
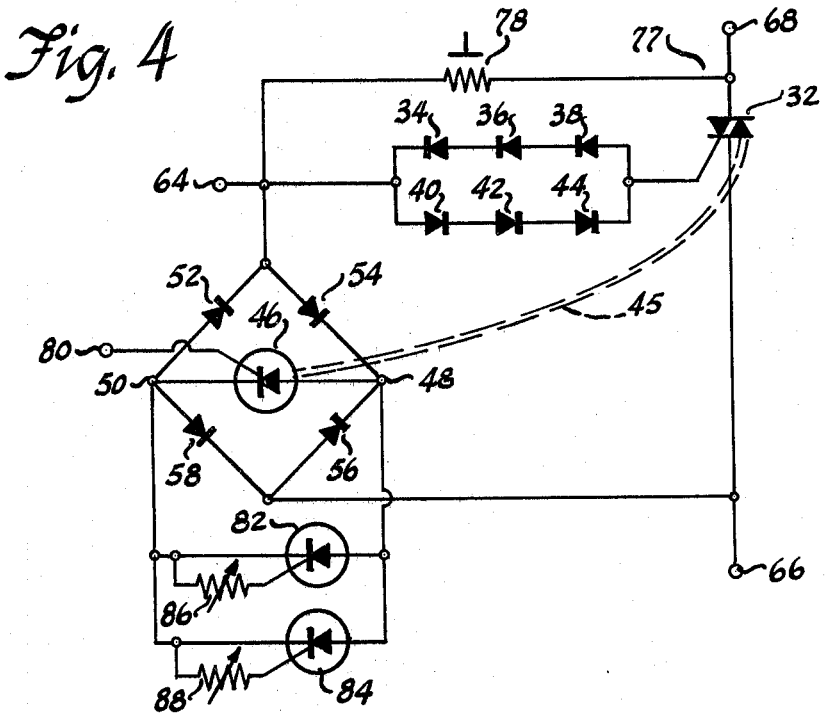
Figure 6:
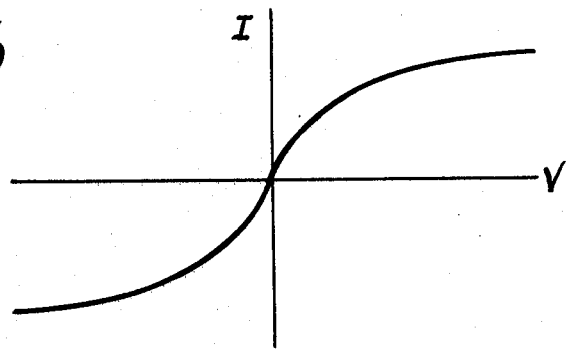
FIG. 6 is a graph depicting the voltage to current characteristic of a buried FET (field effect transistor) pinch resistor.

There is shown in FIG. 4 a device 77 which is a variation of device 30, FIG. 2, and like reference numerals are used for corresponding parts. While device 30 is normally off until gated on, device 77 is normally on until gated off. Gate terminal 64 is connected to main terminal 68 through current saturation means such as buried FET pinch resistor 78. This current saturation means is known in the art and is like that described in the textbook "Analog Integrated Circuit Design" by Alan B. Grebene, Van Nostrand Reinhold Company, 1972, pp. 104-108. Current saturation means have a voltage-current characteristic like that shown in FIG. 6 whereby to allow current flow therethrough as the voltage rises at the beginning of its cycle but limiting the amount of current therethrough at higher voltages in the cycle to prevent excessive gate current. Triac 32 is thus substantially continuously gated into conduction by line current flowing through current saturation means 78 and diodes 34-44, whereby device 77 is normally on.

Device 77 may be gated off by a signal current applied to a gate 80 of temperature sensitive thyristor 46 to trigger the latter into conduction and shunt gate current away from the gate of triac 32 whereby the triac will conduct only during the remainder of the cycle until zero-crossing of the line voltage whereafter it will be non-conductive.

Device 77 has a wide variety of applications in temperature control systems. For example, when used as a thermostat, it may include additional temperature sensitive thyristors 82 and 84 each connected in parallel with thyristor 46 across the D.C. outputs 48 and 50 of the rectifying diode bridge, and may be like those disclosed in said Jaskolski et al Patent or said Jaskolski et al Application. Variable resistances 86 and 88 may be included to vary the switching temperatures. Thyristor 82, for example, may be placed adjacent a furnace and thyristor 84 in a room to be heated. The furnace ignition is connected to the main terminal 66 and 68 of the triac and is energized when each of the thyristors 46, 82 and 84 is in its high resistance state whereby gate current flows from the line through current saturation means 78 to the gate of the triac. If any of the thyristors 46, 82 and 84 intrinsically switches to its low resistance state in response to temperature, gate current will be diverted therethrough and the triac rendered non-conductive. Thyristor 84 thus causes deenergization of the furnace when the room temperature is above a desired level. Thyristor 82 senses the temperature of the furnace itself to protect the furnace by cutting out power thereto when it gets too hot. Multiple parallel sensors can be used if desired. Thyristor 46 protects the triac as before Other temperature sensitive thyristors can be added and other circuit variations are of course possible to provide numerous types of temperature control systems, all having automatic thermal self-protection.

Figure 5:
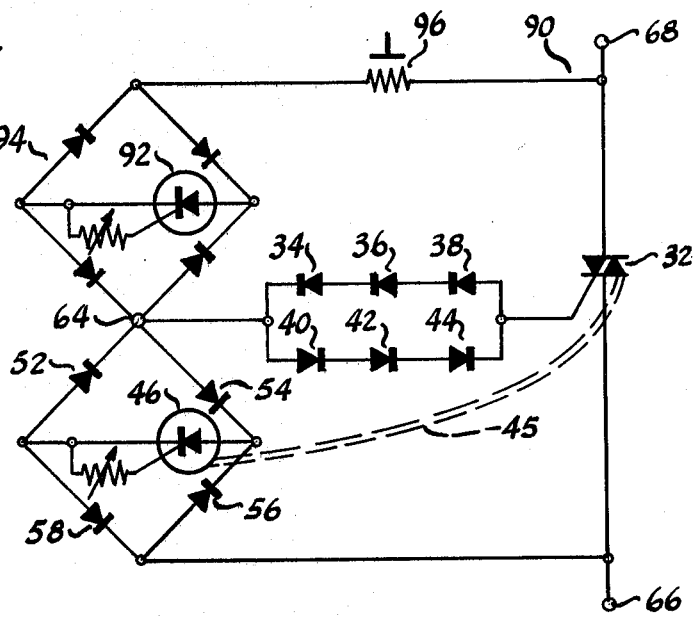

There is shown in FIG. 5 a device 90 which is a bilateral version of device 72, FIG. 3. Device 90 may be built from device 30 of FIG. 2 and thus like reference numerals are used for corresponding parts. A second temperature thyristor 92 is connected in series with the gate of the triac through a rectifying diode bridge 94 having its D.C. outputs connected across thyristor 92 and one of its A.C. inputs connected to gate terminal 64 and its other input terminal connected to a source of signal current, for example it may be gated by line current through buried FET pinch resistor 96 connected to main terminal 68. Device 90 is normally off, but when the temperature of a refrigerated compartment, for example, exceeds a designated value, thyristor 92, placed therein, will intrinsically switch to its low resistance state whereby to allow current to flow to the gate of the triac and trigger the triac into conduction which energizes, for example, a compressor connected in series with main terminals 66 and 68. Thyristor 46 protects the triac, and the compressor if desired, from overloading.

It is recognized that various modifications of the embodiments disclosed are possible within the scope of the invention claimed.

What is claimed is:

1. A thermally self-protected power switching semiconductor device comprising:
   a power switching thyristor having a pair of main terminals for carrying load current and a gate for controlling the conduction state thereof;
   a gate terminal electrically connected to said gate for carrying signal current thereto;
   a temperature sensitive thyristor thermally coupled to said power switching thyristor and electrically connected to said gate terminal in parallel with said gate, said temperature sensitive thyristor being thermally actuatable to intrinsically switch between high and low resistance states such that said temperature sensitive thyristor senses a predetermined temperature of said power switching thyristor and automatically responds thereto by switching to said low resistance state to shunt said gate, said predetermined temperature being less than the thermal breakover temperature of said power switching thyristor.

2. The device according to claim 1 wherein said temperature sensitive thyristor is connected between said gate terminal and one of said main terminals.

3. The device according to claim 1 further comprising voltage dropping means connected in series with said gate between said gate and the junction of said temperature sensitive thyristor and said gate terminal, the sum of the voltage drops across said voltage dropping means and said gate being greater than the voltage drop across said temperature sensitive thyristor in said low resistance state, the voltage drop across said voltage dropping means being less than a value which would reduce the voltage drop across said gate below that necessary to trigger said power switching thyristor into conduction.

4. The device according to claim 3 wherein said voltage dropping means comprises one or more diodes.

5. The device according to claim 1 wherein said predetermined temperature is less than a temperature corresponding to a designated value of said load current whereby to afford load protection.

6. The device according to claim 1 further comprising a second temperature sensitive thyristor connected in series with said gate.

7. The device according to claim 6 wherein said second temperature sensitive thyristor has a lower switching temperature than said first mentioned temperature sensitive thyristor.

8. The device according to claim 7 further comprising voltage dropping means in series with said gate to insure shunting of said gate when said first mentioned thyristor is in said low resistance state.

9. The device according to claim 1 further comprising a variable resistance connected across a gate and cathode of said temperature sensitive thyristor for adjusting the switching temperature thereof.

10. The device according to claim 6 further comprising at least one variable resistance connected across a gate and cathode of at least one of said temperature sensitive thyristors for adjusting the switching temperature thereof.

11. The device according to claim 3 wherein said power switching thyristor is a unilateral triode thyristor and said temperature sensitive thyristor is a unilateral triode thyristor having its anode connected to said gate terminal and its cathode connected to the cathode of said power switching thyristor.

12. The device according to claim 3 wherein said power switching thyristor is a bilateral triode thyristor and said temperature sensitive thyristor is a unilateral triode thyristor, and further comprising a rectifying bridge having A.C. inputs connected between said gate terminal and one of said main terminals and having D.C. outputs connected across an anode and cathode of said temperature sensitive thyristor.

13. The device according to claim 12 wherein said bridge comprises four diodes.

14. The device according to claim 12 wherein said voltage dropping means comprises two or more anti-parallel diodes.

15. The device according to claim 2 wherein said gate terminal is connected to the other of said main terminals through current saturation means such that said signal current is derived from a power source connected to said main terminals.

16. The device according to claim 15 wherein said temperature sensitive thyristor has a gate for triggering said temperature sensitive thyristor into conduction independently of said temperature responsive intrinsic switching.

17. The device according to claim 15 further comprising a second temperature sensitive thyristor connected in series with said current saturation means between said other main terminal and said gate.

18. The device according to claim 12 wherein gate terminal is connected to the other of said main terminals through current saturation means.

19. The device according to claim 18 further comprising one or more additional temperature sensitive thyristors each connected in parallel with said first mentioned thyristor.

20. The device according to claim 12 further comprising: a second rectifying bridge having A.C. inputs connected between said gate terminal and the other of said main terminals; current saturation means in series with said second bridge; and a second temperature sensitive thyristor connected between D.C. outputs of said second bridge.

21. A thermally self-protected power switching semiconductor device comprising:
 a power switching thyristor having a pair of main terminals for carrying load current and a gate for controlling the conduction state thereof;
 a gate terminal electrically connected to said gate for carrying signal current thereto;
 a temperature sensitive thyristor thermally coupled to said power switching thyristor and electrically connected to said gate terminal in parallel with said gate, said temperature sensitive thyristor being thermally actuatable to intrinsically switch between high and low resistance states such that said temperature sensitive thyristor senses a predetermined temperature of said power switching thyristor and automatically responds thereto by switching to said low resistance state to shunt said gate, the thermal breakover temperature of said temperature sensitive thyristor being less than the thermal breakover temperature of said power switching thyristor whereby said predetermined temperature is less than the thermal breakover temperature of said power switching thyristor.

* * * * *